(12) United States Patent
Minich

(10) Patent No.: US 9,504,140 B2
(45) Date of Patent: Nov. 22, 2016

(54) PCB HAVING OFFSET DIFFERENTIAL SIGNAL ROUTING

(71) Applicant: FCI Americas Technology LLC, Carson City, NV (US)

(72) Inventor: Steven E. Minich, York, PA (US)

(73) Assignee: FCI Americas Technology LLC, Carson City, NV (US)

( * ) Notice: Subject to any disclaimer, the term of this patent is extended or adjusted under 35 U.S.C. 154(b) by 105 days.

(21) Appl. No.: 14/164,320

(22) Filed: Jan. 27, 2014

(65) Prior Publication Data

US 2014/0209370 A1    Jul. 31, 2014

Related U.S. Application Data

(60) Provisional application No. 61/758,255, filed on Jan. 29, 2013.

(51) Int. Cl.
*H05K 1/02* (2006.01)
*H05K 1/11* (2006.01)
(Continued)

(52) U.S. Cl.
CPC .......... *H05K 1/0245* (2013.01); *G09B 23/183* (2013.01); *H05K 1/0218* (2013.01); *H05K 1/0216* (2013.01); *H05K 1/0222* (2013.01); *H05K 1/0228* (2013.01); *H05K 1/115* (2013.01); *H05K 3/42* (2013.01); *Y10T 29/49165* (2015.01)

(58) Field of Classification Search
CPC ...... H05K 1/0218; H05K 1/115; H05K 3/10; H05K 3/42; H05K 1/0245; H05K 1/0222; H05K 1/0216; H05K 1/0228; H05K 1/0248; H05K 1/0253; H05K 1/141; H05K 3/30; H05K 3/341; H05K 3/36; G09B 19/00; G09B 23/183; Y10T 29/49165

USPC ................. 174/250–268; 361/360, 692–695; 333/1, 12
See application file for complete search history.

(56) References Cited

U.S. PATENT DOCUMENTS 6,384,341 B1 * 5/2002 Rothermel ........... H05K 1/0219
174/250
6,394,822 B1    5/2002 McNamara
(Continued)

OTHER PUBLICATIONS

"SFF-8643 Specification for Mini Multilane 12 Gbs 8/4x Unshielded Connector, Rev 2.3", SFF Committee, Jan. 11, 2011, 24 pages.
(Continued)

*Primary Examiner* — Ishwarbhai B Patel
(74) *Attorney, Agent, or Firm* — Wolf, Greenfield & Sacks, P.C.

(57) ABSTRACT

In accordance with the various embodiments disclosed herein, an improved electrical connector footprints, such as printed circuit boards (printed circuit board), is described comprising one or more of, for example, a first linear array containing at least a first anti-pad extending along a first direction, a first electrical signal trace extending along the first direction and spaced from the first linear array along a second direction that is perpendicular to the first direction, a group of ground isolation vias containing at least one electrically conductive ground via arranged along a line extending parallel to the first direction and spaced from the first electrical signal trace along the second direction, and a second linear array containing at least a second anti-pad extending along the first direction spaced from the group of ground isolation vias along the second direction.

12 Claims, 3 Drawing Sheets

(51) Int. Cl.
  *G09B 23/18* (2006.01)
  *H05K 3/42* (2006.01)

(56) References Cited

U.S. PATENT DOCUMENTS

| | | | |
|---|---|---|---|
| 7,819,697 B2 | 10/2010 | Glover et al. | |
| 8,080,738 B2 | 12/2011 | Morgan | |
| 8,251,745 B2 | 8/2012 | Johnescu et al. | |
| 8,273,994 B2 | 9/2012 | Reynov et al. | |
| 8,715,006 B2 * | 5/2014 | Jeon | H01R 12/585 439/607.1 |
| 2012/0003848 A1 | 1/2012 | Casher et al. | |
| 2012/0199380 A1 | 8/2012 | Olsen | |
| 2012/0243184 A1 | 9/2012 | Lee | |
| 2012/0252232 A1 | 10/2012 | Buck et al. | |
| 2013/0215587 A1 * | 8/2013 | Kawai | H05K 1/115 361/783 |

OTHER PUBLICATIONS

"Strada Whisper Connector Daughtercard Footprint", Tyco Electronics, Mar. 24, 2010, 1 page.

Zipline Connector System, http://www.slideshare.net/element14/zipline-connector-system, Mar. 10, 2011.

* cited by examiner

PCB HAVING OFFSET DIFFERENTIAL SIGNAL ROUTING

CROSS-REFERENCE TO RELATED APPLICATIONS

This claims the benefit of U.S. Provisional Patent Application Ser. No. 61/758,255 filed on Jan. 29, 2013, the disclosure of which is hereby incorporated by reference as if set forth in its entirety herein.

BACKGROUND

Conventional printed circuit boards (PCBs) include electrically insulative layers and electrically conductive layers alternatingly arranged along the thickness of the printed circuit board. Certain ones of the electrically conductive layers are typically configured as signal layers, and certain others of the electrically conductive layers are typically configured as ground layers. The signal layers each can include electrical signal traces that are supported and surrounded by electrically insulative material, and the ground layers can include one or more electrically conductive regions that are supported and surrounded by electrically insulative material. Because the ground layers are disposed between adjacent signal layers, the ground layers provide shielding between the electrical signal traces of one signal layer and the electrical signal traces of the adjacent signal layer. Conventional printed circuit boards can include at least first and second linear arrays that each contain signal vias and ground vias. The ground vias extend through at least one of the signal layers and are placed in electrical communication with the electrically conductive region of a respective one of the at least one ground layer. The signal vias can be arranged in first and second differential signal pairs that are placed in electrical communication with respective first and second sets of electrical differential signal traces that route electrical signals along the printed circuit board. The first linear array includes the signal vias of the first differential signal pair, and the second linear array includes the signal vias of the second differential signal pair. Each of the first and second linear array can include a respective at least one ground via. The electrical signal traces are positioned between the first and second linear arrays, and are oriented parallel to the linear arrays. The electrical differential signal traces are positioned so as to be symmetrical about a center line that extends equidistantly between the first and second linear arrays. In certain implementations, conventional printed circuit boards further include first and second arrays of ground vias that are disposed between the respective first and second linear arrays and the electrical signal traces.

SUMMARY

In accordance with one embodiment, a printed circuit board can include at least one electrical signal trace elongate along a first direction. The printed circuit board can further include an electrically conductive ground layer disposed below the first electrical signal trace along a second direction that is perpendicular to the first direction, the electrically conductive ground layer extending along a plane that is normal to the second direction. The printed circuit board can further include a first linear array that includes at least one electrically conductive signal via and at least one electrically conductive ground via, the first linear array oriented along the first direction. The printed circuit board can further include a second linear array that includes at least one electrically conductive signal via and at least one electrically conductive ground via, the second linear array oriented along the first direction. The second linear array can be spaced from and consecutive with the first linear array along a third direction that is perpendicular with respect to each of the first and second directions. The at least one electrical signal trace can be disposed between the first and second linear arrays with respect to the third direction. The printed circuit board can further include at least one group of ground isolation vias that is oriented along the first direction, the at least one group of ground isolation vias disposed between the first electrical signal trace and the second linear array with respect to the second direction.

BRIEF DESCRIPTION OF THE DRAWINGS

The foregoing summary, as well as the following detailed description of an example embodiment of the application, will be better understood when read in conjunction with the appended drawings. For the purposes of illustrating the present disclosure, there is shown in the drawings an example embodiment. It should be understood, however, that the application is not limited to the precise arrangements and instrumentalities shown. In the drawings.

DETAILED DESCRIPTION

The present disclosure may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any sub combination. Further, reference to values stated in ranges include each and every value within that range. Unless otherwise noted, common reference numbers among the Figures should be understood to refer to similar features.

Figure 1:
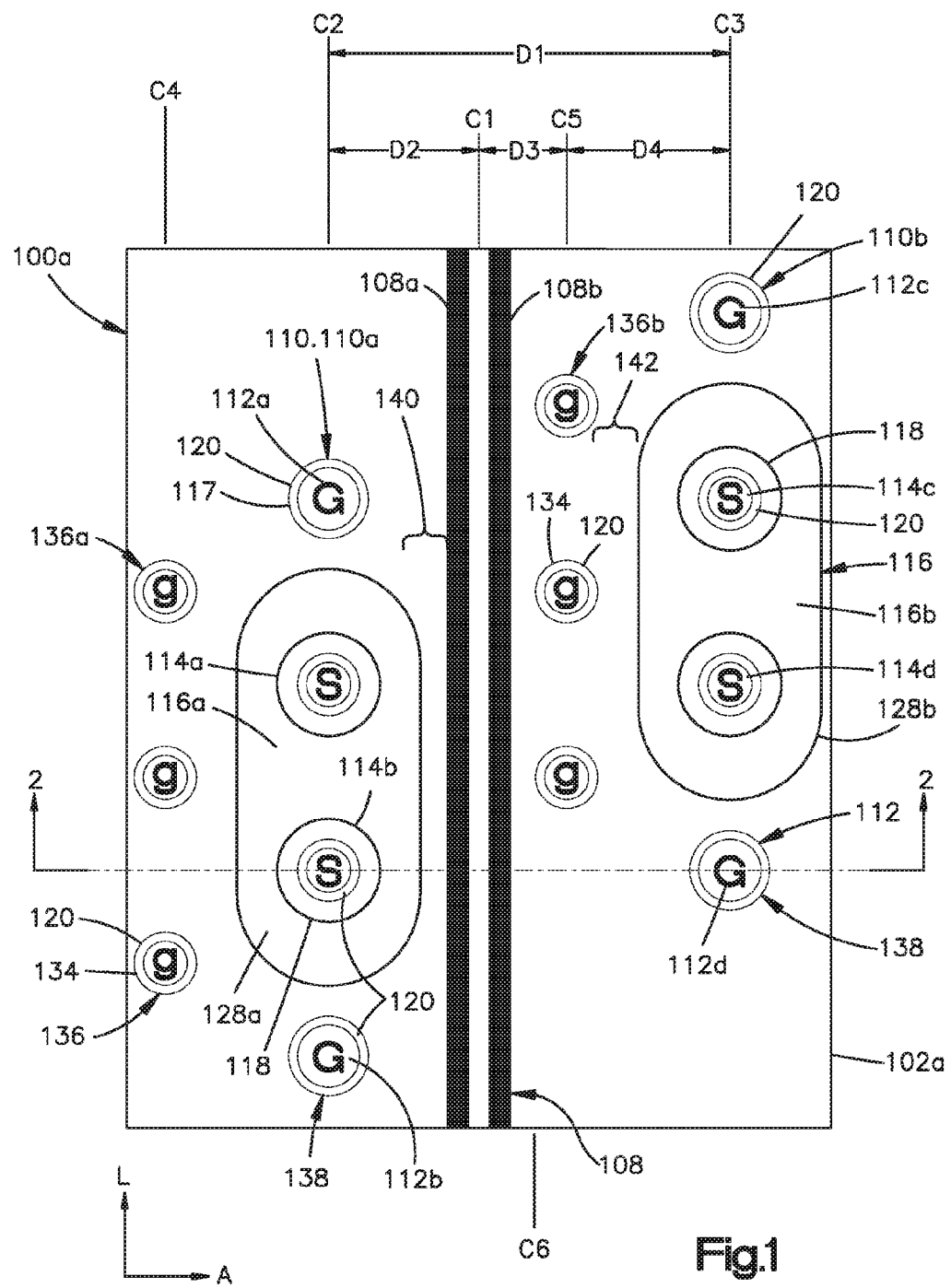
FIG. 1 is a top view of a portion of a printed circuit board constructed in accordance with one embodiment.
Figure 2:
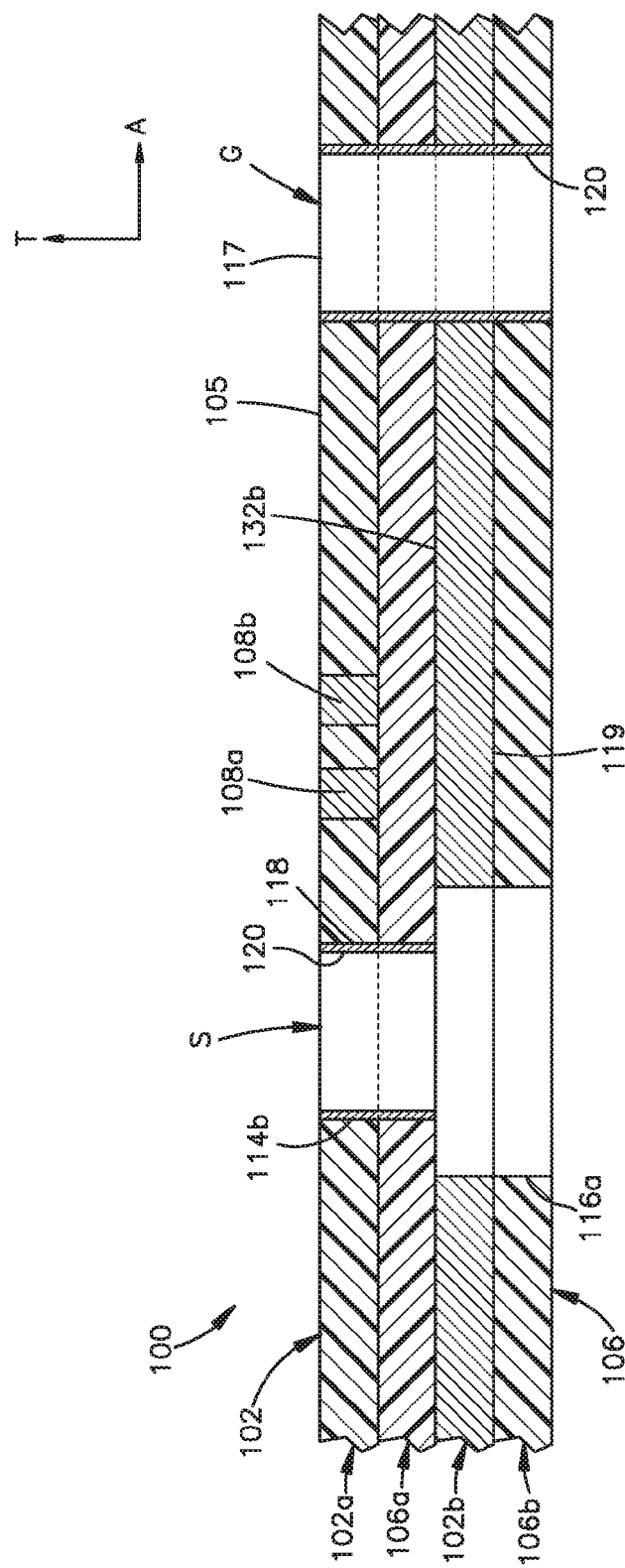
FIG. 2 is a sectional side elevation view of the portion of the printed circuit board illustrated in FIG. 1, taken along line along line 2-2.

Referring to FIGS. 1-2 generally, a printed circuit board (PCB) 100 can be configured as a daughter card or alternatively constructed circuit board that is configured to be placed in electrical communication with electrical contacts of a complementary electrical connector that is mounted to the electrical connector. For instance, the printed circuit board 100 can include a dielectric or electrically insulative material, such as glass-filled or glass impregnated epoxy, electrical signal mounting locations supported by the electrically insulative material, and electrical ground mounting locations supported by the electrically insulative material. The signal mounting locations are configured to be placed in electrical communication with mounting portions of electrical signal contacts of the complementary electrical connector, and the ground mounting locations are configured to be placed in electrical communication with mounting portions of electrical ground contacts of the complementary electrical connector. For instance, the signal mounting portions can be configured as signal vias S that define respective electrically plated holes, and the ground mounting portions can be configured as ground vias G that define respective electrically plated holes. The signal vias S are configured to receive press-fit tails of electrical signal contacts of the complementary electrical connector, and the ground vias G are configured to receive press-fit tails of electrical ground contacts of the complementary electrical connector. It should be appreciated that the signal mounting portions and ground mounting portions can alternatively be configured as contact pads that are configured to be placed in contact with the respective mounting portions of the signal contacts and ground contacts of the complementary electrical connector that are surface mounted to the contact pads. The signal mounting portions are in electrical communication with respective signal traces 108 that are configured to route electrical signals along the printed circuit board 100.

Referring now to FIGS. 1 and 2, the printed circuit board 100 can be generally planar along a longitudinal direction L and a lateral direction A that is perpendicular to the longitudinal direction L. The printed circuit board 100 has a length that extends along the longitudinal direction L and a width that extends along the lateral direction A. The length can be equal to, greater than, or less than, the width. The printed circuit board 100 further has a thickness that extends along a transverse direction T that is perpendicular to each of the longitudinal direction L and the lateral direction A. The longitudinal direction L can be referred to as a first direction. The transverse direction T can be referred to as a second direction. The lateral direction A can be referred to as a third direction.

The printed circuit board 100 can include at least one electrically conductive layer 102, such as a plurality of electrically conductive layers 102. The electrically conductive layers 102 can include a first electrically conductive layer 102a and a second electrically conductive layer 102b. Consecutive ones of the conductive layers 102 can be arranged above or below each other along the transverse direction T such that no additional electrically conductive layers are disposed between the consecutive ones of the conductive layers 102. In one embodiment, the first and second conductive layers 102a and 102b can be consecutive electrically conductive layers. Thus, the second electrically conductive layer 102b can be disposed below the first electrically conductive layer 102a along the transverse direction T. Accordingly, the first electrically conductive layer 102a can be referred to as an upper electrically conductive layer, and the second electrically conductive layer 102b can be referred to as a lower electrically conductive layer. Each of the first and second electrically conductive layers 102a and 102b can be substantially planar along respective planes that are defined by the longitudinal direction L and the lateral direction A.

The printed circuit board 100 can further include at least one dielectric or electrically insulative layer 106, such as a plurality of dielectric or electrically insulative layers 106 that are alternatingly arranged with the electrically conductive layers 102 along the transverse direction T. Thus, the electrically insulative layers 106 are configured to electrically isolate two immediately adjacent ones of the consecutive conductive layers 102 from one another. The dielectric layers 106 may be comprised of any suitable electrically insulative material, such as glass-filled or glass impregnated epoxy, that prevents the flow of electricity therethrough. The electrically insulative layers 106 can include a first electrically insulative layer 106a and a second electrically insulative layer 106b. The first and second electrically insulative layers 106a and 106b can be arranged consecutively along the transverse direction T. Consecutive ones of the electrically insulative layers 106 can be arranged above or below each other along the transverse direction T such that no additional electrically insulative layers are disposed between the consecutive ones of the insulative layers 106. In one embodiment, the first and second insulative layers 106a and 106b can be consecutive insulative layers. Thus, the second electrically insulative layer 106b can be disposed below the first electrically insulative layer 106a along the transverse direction T. Accordingly, the first electrically insulative layer 106a can be referred to as an upper electrically insulative layer, and the second electrically insulative layer 106b can be referred to as a lower electrically insulative layer. Each of the first and second electrically insulative layers 106a and 106b can be substantially planar along respective planes that are defined by the longitudinal direction L and the lateral direction A.

The electrically conductive layers 102 and the electrically insulative layers 106 can be alternatingly arranged with respect to each other along the transverse direction T. Thus, the first electrically insulative layer 106a can be disposed between the first electrically conductive layer 102a and the second electrically conductive layer 102b. The second electrically conductive layer 102b can be disposed between the first electrically insulative layer 106a and the second electrically insulative layer 106b.

FIG. 1 illustrates a top view of a portion of the printed circuit board 100, whereby the second electrically conductive layer 102b is visible through the first electrically conductive layer 102a for the sake of clarity. Further, for the sake of clarity, the first and second electrically insulative layers 106a and 106b are depicted as being transparent. It should be understood that additional conductive layers 102 and/or electrically insulative layers may be present above or below the electrically conductive layers 102 along the transverse direction T as desired.

The electrically conductive layers 102 may include at least one electrical signal layer such as a plurality of electrical signal layers. For instance, one of the first and second electrically conductive layers 102a and 102b can be configured as an electrical signal layer, and the other of the first and second electrically conductive layers 102a and 102b can be configured as an electrical ground layer. In accordance with the illustrated embodiment, the first electrically conductive layer 102a is configured as an electrical signal layer, and the second electrically conductive layer 102b is configured as an electrical ground layer. Thus, the electrical signal layer 102a is configured to transmit electrical data signals along the printed circuit board 100. The ground layer 102b can extend along a plane that is normal to the transverse direction T.

It should be appreciated that while FIGS. 1-2 depict one example configuration of the printed circuit board 100, the conductive layers 102 and the dielectric layers 106 may be arranged in a variety of sequences along the transverse direction T. Thus, the instant disclosure should not be construed as limited to the configuration show in FIGS. 1-2. For example, one or more electrically conductive layers 102, which can be configured as electrical signal layers, ground layers, or both, alone or in combination with one or more electrically insulative layers 106, may be located above or below the portion of the printed circuit board 100 illustrated in FIGS. 1-2. Thus, an additional electrically insulative layer 106 can be disposed above the first electrically conductive layer 102a. Furthermore, the printed circuit board 100 can be devoid of the second electrically insulative layer 106b. One or more of the electrically conductive layers 102 can alternatively or additionally be configured as electrical power layers that are configured to transmit electrical power along the printed circuit board 100. For instance, the printed circuit board can include one or more electrical power layers that are configured to transmit electrical power along the printed circuit board 100 from the complementary electrical connector to another electrical device that is in electrical communication with the printed circuit board 100.

The first electrical signal layer 102a can include a dielectric or electrically insulative material 105 and at least one electrically conductive trace 108 embedded or otherwise carried by the electrically insulative material 105. For instance, the first electrical signal layer 102a can include a plurality of electrically conductive traces 108 carried by the electrically insulative material 105. Each of the electrically conductive traces 108 can be configured as electrically conductive signal traces, or electrical signal traces. For instance, the first electrical signal layer 102a can include first and second electrically conductive traces 108a and 108b that combine with each other to define a differential signal pair of electrically conductive traces. The electrically conductive traces 108 can include any suitable electrically conductive material as desired, such as copper. Each of the first and second electrical traces 108a and 108b can be elongate in the longitudinal direction L. The first and second electrical traces 108a and 108b can be disposed in respective routing channels in the electrical signal layer 102a.

The first and second electrically conductive traces 108a and 108b can further be centered about a corresponding first center line C1. The first center line C1 can be referred to as a first center line. The first center line C1 can extend along the longitudinal direction L. Thus, the first and second electrically conductive traces 108a and 108b can be oriented parallel to the first center line C1. Further, the first and second electrically conductive traces 108a and 108b can be centered about the center line C1 with respect to the lateral direction A. That is, the center line C1 can be disposed centrally between the first and second electrically conductive traces 108a and 108b with respect to the second direction of the first electrical signal layer 102a. Accordingly, the first center line C1 is equidistantly spaced form the first and second electrically conductive traces 108a and 108b along the lateral direction A.

The printed circuit board 100 can further include a plurality of ground vias G which can be understood to be electrically conductive ground vias, and a plurality signal vias S which can be understood to be electrically conductive signal vias. Select ones of the ground vias G and the signal vias S can be arranged in a respective at least one linear array 110. The at least one linear array 100 can include a first linear array 110a and a second linear array 110b that is spaced from the first linear array 110a along the lateral direction A, such that the first center line C1 is disposed between the first and second linear arrays 110a and 110b along the lateral direction A. For instance, the first center line C1 can be equidistantly spaced between the first linear array 110a and the second linear array 110b. Each of the first and second linear arrays 110a and 110b can include at least one of the ground vias G and at least one of the signal vias S. For instance, the printed circuit board 100 can include a first linear array 110a and a second linear array 110b.

The plurality of ground vias G can include a first ground via 112a and a second ground via 112b. The first linear array 110a can include the first ground via 112a. The first linear array can further include the second ground via 112b that is aligned with the first ground via 112a along the longitudinal direction L. Thus, it can be said that the first linear array 110a can include a pair of ground vias 112a-b. Each of the first and second ground vias 112a and 112b, respectively, may define a respective hole 117 that extends along the transverse direction T at least partially through the printed circuit board 100. For instance, the holes 117 can extend into two or more of the electrically conductive layers 102 and the electrically insulative layers 106. Each hole 117 can be at least partially plated, including fully plated, with an electrically conductive surface 120, such that each of the first and second ground vias 112a and 112b can be referred to as a plated through-hole. Alternatively or additionally, each hole 117 can be partially filled with an electrically conductive material, such as metal. Thus, each of the first and second ground vias 112a and 112b can be referred to as an electrically conductive via. Further, each hole 117 can have a size and shape that is configured to receive a respective one of a plurality of mounting portions of electrical ground contacts of the complementary electrical connector that is mounted to the printed circuit board 100. The ground layer 102b can include an electrical conductive region that is defined by any suitable electrically conductive material 119, such as copper, that is in electrical communication with each of the first and second ground vias 112a and 112b.

The plurality of signal vias S can include a first signal via 114a and a second signal via 114b. The first linear array 110a can further include the first signal via 114a. The first linear array 110a can further include the second signal via 114b that is aligned with the first signal via 114a along the longitudinal direction L. Thus, it can be said that the first linear array 110a can include a pair of signal vias 114a-b. Each of the first signal via 114a and the second signal via 114b each can be disposed between the first and second ground vias 112a and 112b, respectively, along the longitudinal direction L. Further, each of the first and second signal vias 114a and 114b can be aligned with the first and second ground vias 112a and 112b along the longitudinal direction L. For instance, the pair of signal vias 114a-b the first linear array 110a can be equidistantly spaced between the first and second ground vias 112a and 112b. The first linear array 110a can be centered with respect to the lateral direction A about a respective first array center line C2 that extends along the longitudinal direction L. Accordingly, the first array center line C2 can extend parallel to the first and second electrically conductive traces 108a and 108b, respectively.

The first and second signal vias 114a-b can, in combination, define a differential signal pair of signal vias configured to receive corresponding mounting portions of electrical signal contacts of a differential signal pair of the complementary electrical connector that is mounted to the printed circuit board 100. Alternatively, the first and second signal vias 114a and 114b, respectively, can each be single ended. Each of the first and second electrically conductive via 114a and 114b, respectively, may define a respective hole 118 that extends along the transverse direction at least partially through the printed circuit board 100. For instance, the holes 118 can extend into two or more of the electrically conductive layers 102 and the electrically insulative layers 106. Each hole 118 can be at least partially plated, including fully plated, with a conductive surface 120, such that each of the first and second signal vias 114a and 114b can be referred to as a plated through-hole. Alternatively or additionally, each hole 118 can be partially filled with a conductive metal. Thus, each of the first and second signal vias 114a and 114b can be referred to as an electrically conductive via. Further, each hole 118 can have a size and shape that is configured to receive a respective one of a plurality of mounting portions of electrical signal contacts of the complementary electrical connector that is mounted to the printed circuit board 100. The first signal via 114a can be in electrical communication with the first electrically conductive trace 108a. Similarly, the second signal via 114b can be in electrical communication with the second electrically conductive trace 108. For instance, the first electrically conductive layer 102a, can include a first auxiliary electrically conductive trace that is electrically connected between the first signal via 114a and the first electrically conductive trace 108a. Similarly, the first electrically conductive layer 102a, can include a second auxiliary electrically conductive trace that can be electrically connected between the second signal via 114b and the second electrically conductive trace 108b. For example, the first auxiliary electrically conductive trace can contact an electrically conductive surface of the plated-through-hole of the first signal via 114a. Similarly, the second auxiliary electrically conductive trace can contact an electrically conductive surface of the plated-through-hole of the second signal via 114b.

According to one embodiment, each of the first and second ground vias 112a-b and the first and second signal vias 114a-b of the first linear array 110a can be at least partially aligned with the first array center line C2. For instance, each of the ground vias G and the signal vias S of the first linear array 110a can be fully aligned with the first array center line C2. When the ground vias G and the signal vias S of the first linear array 110a are partially aligned with the first array center line C2, the first array center line C2 passes through each of the ground vias G and the signal vias S of the first linear array 110a. When the ground vias G and the signal vias S of the first linear array 110a are fully aligned with the first array center line C2, the first array center line C2 passes centrally through each of the ground vias G and the signal vias S of the first linear array 110a.

Further, the first linear array 110a can define any repeating pattern 138 of vias as desired along the longitudinal direction L, which can be referred to as a column direction. For instance, the repeating pattern can be a G-S-S pattern, a G-S-S-G pattern, a G-S-G pattern, a S-G-S pattern, a S-S-G, a G-S pattern, or any suitable alternative pattern as desired. As described in more detail below, each signal via 114 may also be understood as being surrounded by an anti-pad 116, which can be considered part of the above linear array patterns 138.

The plurality of ground vias G can include a third ground via 112c and a fourth ground via 112d. The second linear array 110b can include the third ground via 112c. The second linear array 110b can further include the fourth ground via 112d that is aligned with the third ground via 112c along the longitudinal direction L. Thus, it can be said that the second linear array 110b can include a pair of ground vias 112c-d. Each of the third and fourth ground vias 112c and 112d, respectively, may define a respective hole 117 that extends along the transverse direction T at least partially through the printed circuit board 100. For instance, the holes 117 can extend into two or more of the electrically conductive layers 102 and the electrically insulative layers 104. Each hole 117 can be at least partially plated, including fully plated, with a conductive surface 120, such that each of the third and fourth ground vias 112c and 112d can be referred to as a plated through-hole. Alternatively or additionally, each hole 117 can be partially filled with a conductive metal. Thus, each of the third and fourth ground vias 112c and 112d can be referred to as an electrically conductive via. Further, each hole 117 can have a size and shape that is configured to receive a respective one of a plurality of mounting portions of electrical ground contacts of the complementary electrical connector that is mounted to the printed circuit board 100. The electrically conductive material 119 of the ground layer 102b can be in electrical communication with each of the third and fourth ground vias 112c and 112d. For example, the electrically conductive material 119 can contact an electrically conductive surface of each of the respective plated-through-holes of the third and fourth ground vias 112c and 112d. The electrically conductive material 119 of the ground layer 102b that is in electrical communication with the first and second ground vias 112a and 112b can further be in electrical communication with the electrically conductive material 119 of the ground layer 102b that is in electrical communication with the third and fourth ground vias 112c and 112d, or can be electrically isolated from electrically conductive material 119 of the ground layer 102b that is in electrical communication with the third and fourth ground vias 112c and 112d.

The plurality of signal vias S can include a third signal via 114c and a fourth signal via 114d. The second linear array 110b can further include the third signal via 114c. The second linear array 110b can further include the fourth signal via 114b that is aligned with the third signal via 114c along the longitudinal direction L. Thus, it can be said that the second linear array 110b can include a pair of signal vias 114c-d. Each of the third signal via 114c and the fourth signal via 114d can be disposed between the third and fourth ground vias 112c and 112d, respectively, along the longitudinal direction L. Further, each of the third and fourth signal vias 114c and 114d can be aligned with the third and fourth ground vias 112a and 112b along the longitudinal direction L. For instance, the pair of third and fourth signal vias 114c and 114d of the second linear array 110b can be equidistantly spaced between the third and fourth ground vias 112c and 112d. The second linear array 110b can be centered with respect to the lateral direction A about a respective second array center line C3 that extends along the longitudinal direction L. Accordingly, the second array center line C3 can extend parallel to the first and second electrically conductive traces 108a and 108b, respectively.

The third and fourth signal vias 114c and 114d can combine to define a differential signal pair of signal vias configured to receive corresponding mounting portions of electrical signal contacts of a differential signal pair of the complementary electrical connector that is mounted to the printed circuit board 100. Alternatively, the third and fourth signal vias 114c and 114d, respectively, can each be single ended. Each of the third and fourth electrically conductive via 114c and 114d, respectively, may define a respective hole 118 that extends along the transverse direction at least partially through the printed circuit board 100. For instance, the holes 118 can extend into two or more of the electrically conductive layers 102 and the electrically insulative layers 104. Each hole 118 can be at least partially plated, including fully plated, with a conductive surface 120, such that each of the third and fourth signal vias 114c and 114d can be referred to as a plated through-hole. Alternatively or additionally, each hole 118 can be partially filled with a conductive metal. Thus, each of the third and fourth signal vias 114c and 114d can be referred to as an electrically conductive via. Further, each hole 118 can have a size and shape that is configured to receive a respective one of a plurality of mounting portions of electrical signal contacts of the complementary electrical connector that is mounted to the printed circuit board 100. The third signal via 114c can be in electrical communication with a corresponding third electrical trace of the electrical signal layer 102a, and the fourth signal via 114d can be in electrical communication with a corresponding fourth electrical trace of the electrical signal layer 102a. The third and fourth electrical traces can be configured as described above with respect to the first and second electrical traces.

According to one embodiment, each of the third and fourth ground vias 112c-d and the third and fourth signal vias 114c-d of the second linear array 110b can be at least partially aligned with the second array center line C3. For instance, each of the ground vias G and the signal vias S of the second linear array 110b can be fully aligned with the second array center line C3. When the ground vias G and the signal vias S of the second linear array 110b are partially aligned with the second array center line C3, the second array center line C3 passes through each of the ground vias G and the signal vias S of the second linear array 110b. When the ground vias G and the signal vias S of the second linear array 110b are fully aligned with the second array center line C3, the second array center line C3 passes centrally through each of the ground vias G and the signal vias S of the second linear array 110b.

Further, the second linear array 110a can define any repeating pattern 138 of vias as desired along the longitudinal direction. For instance, the repeating pattern can be a G-S-S pattern, a G-S-S-G pattern, a G-S-G pattern, a S-G-S pattern, a S-S-G, a G-S pattern, or any suitable alternative pattern as desired. As described in more detail below, each signal via 114 may also be understood as being surrounded by an anti-pad 116, which can be considered part of the above linear array patterns 138.

Additionally, the first and second linear arrays 110a-b may consecutive linear arrays 110. Consecutive linear arrays 110 may be understood to be the next linear array beside a given linear array 110 along the lateral direction A, which may also be referred to as a row direction. Consecutive linear arrays 110 may be spaced apart by a first distance D1. Distance D1 may be referred to as the linear array pitch. The linear array pitch D1 for printed circuit board 100 may be selected to match a corresponding card pitch of another electronic device. In an exemplary embodiment, the card pitch and the first distance D1 can be 2.8 mm.

Figure 3:
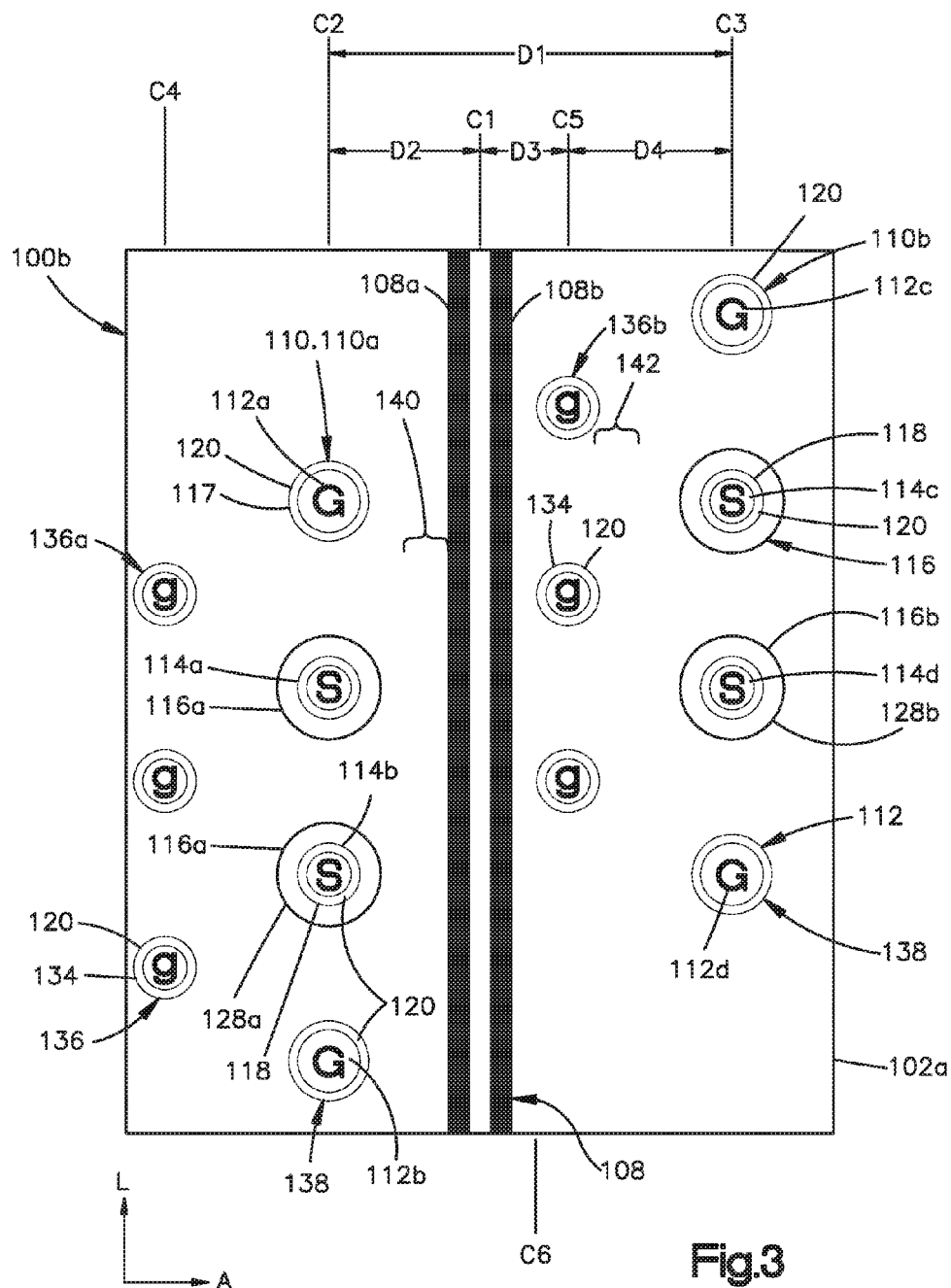
FIG. 3 is a top view of a portion of a printed circuit board similar to FIG. 1, but constructed in accordance with another embodiment.

Further, as depicted in FIGS. 1-3, a pair of traces 108 may be located between consecutive linear arrays 110. The pair of traces 108 can define a differential pair as desired. Each signal via 114 can be in electrical connection with one of the traces 108, and insulated with respect to electrical connection from the others of the electrical traces. Alternatively, a single trace 108 may be located in between consecutive linear arrays 110.

The ground vias G and the signal vias S can be substantially circular as illustrated, though it will be appreciated that they can assume a wide variety of shapes. Each hole 118 of the circular ground vias 112 and signal vias 114 may have a diameter which that extends in a plane that is normal to the transverse direction and is defined by the lateral direction A and longitudinal direction L and may define the area of each of the signal and ground vias S and G, respectively. Thus, each signal and ground via S and G, respectively, can have a respective volume defined as a product of their respective area and their respective thickness along transverse direction T.

With continuing reference to FIGS. 1 and 2, the printed circuit board 100 can further include a plurality of anti-pads 116 that electrically isolate a respective ground layer 102b from respective ones of the signal vias S. For instance, the ground layer 102b can define the anti-pads 116 that electrically isolate the electrically conductive material 119 of the ground layer 102b from the respective ones of the signal vias S. In this regard, it should be appreciated that each of the anti-pads 116 can be defined by a respective void 128 that is disposed in the electrically conductive material 119 of the ground layer 102b. The void 128 can contain air or any suitable alternative dielectric or electrically insulative material. As a result, the anti-pads 116 can prevent the electrically conductive material of the ground layer 102b from being placed in physical contact or otherwise from being placed in electrical communication with the electrically conductive surface of the respective ones of the signal vias S. Each anti-pad 116 may be surrounded by the conductive material 119 of the respective conductive ground layer 102b that surrounds the void 128. Each of the anti-pads 116 may be formed in a variety of ways. For example, the anti-pads 116 may be created by first forming the respective conductive layer, such as the ground layer 102b, and then removing a section of the ground layer 102b to create the respective void 128 through. The removing step can include the step of etching into the ground layer 102b or drilling into the ground layer 102b.

Each anti-pad 116 may have an area which extends along a plane that is normal to the transverse direction T. For example, the normal plane may extend along the lateral direction A and the longitudinal direction L. The maximum area of each anti-pad 116 may be defined by the void 128 in the conductive material of the respective ground layer 102b that surrounds the anti-pad. Each of the anti-pads 116 may also have a volume which may be defined by the product of the respective area and the thickness of the respective ground layer 102b in the transverse direction T.

A first anti-pad 116a of the plurality of anti-pads 116 can be at least partially aligned with the first array center line C2. Further, the first anti-pad can be fully aligned with the first array center line C2. In this regard, it should be appreciated that the first linear array 110a can include the first anti-pad. Furthermore, each of the first and second signal vias 114a and 114b can be aligned with the first anti-pad 116a, such that the first anti-pad 116a electrically isolates each of the first and second signal vias 114a and 114b from the ground layer 102b. Thus, the first anti-pad 116a can be said to be operatively coupled to each of the first and second signal vias 114a and 114b. Though the first anti-pad 116a need not be aligned with the first and second vias 114a and 114b with respect to a direction that is perpendicular to the transverse direction T, the first anti-pad 116a can define an outer perimeter that is nevertheless said to surround the first and second vias 114a and 114b (for instance, with respect to a view along the transverse direction T). Similarly, a second anti-pad 116b of the plurality of anti-pads 116 can be at least partially aligned with the second array center line C3. Further, the second anti-pad 116b can be fully aligned with the second array center line C3. In this regard, it should be appreciated that the second linear array 110b can include the second anti-pad 116b. Furthermore, each of the third and fourth signal vias 114c and 114d can be aligned with the second anti-pad 116b, such that the second anti-pad 116b electrically isolates each of the third and fourth signal vias 114c and 114d from the ground layer 102b. Thus, the second anti-pad 116b can be said to be operatively coupled to each of the third and fourth signal vias 114c and 114d. Though the second anti-pad 116b need not be aligned with the third and fourth vias 114c and 114d with respect to a direction that is perpendicular to the transverse direction T, the second anti-pad 116b can define an outer perimeter that nevertheless said to surround the third and fourth vias 114c and 114d (for instance, with respect to a view along the transverse direction T).

In this regard, it should be appreciated that the anti-pads 116 may define a variety of shapes such as, for example, ovular as illustrated in FIG. 1. Alternatively, as illustrated in FIG. 3, the anti-pads 116 can alternatively define a circular shape, though it should be appreciated that the anti-pads can alternatively be square, rectangular, or any suitable alternative shape as desired. Further, as illustrated in FIG. 3, each of the first and second signal vias 114a and 114b can be aligned with respective ones of the anti-pads 116 that are spaced from each other, for instance along the longitudinal direction L. Thus, it can be said that at least one of the first and second signal vias 114a and 114b can be aligned with an anti-pad. The first and second signal vias 114a and 114b can be aligned with a common one of the anti-pads 116 as illustrated in FIG. 1, or the first and second signal vias 114a and 114b can be aligned with respective separate ones of the anti-pads 116 that are spaced from each other as illustrated in FIG. 3. Thus, it can be said that at least one of the first and second signal vias 114a and 114b can be surrounded by an outer perimeter of an antipad (for instance, with respect to a view along the transverse direction T). Each of the first and second signal vias 114a and 114b can be surrounded by a perimeter of a single common one of the anti-pads 116 as illustrated in FIG. 1, or the first and second signal vias 114a and 114b can be surrounded by respective perimeters of separate ones of the anti-pads 116 that are spaced from each other as illustrated in FIG. 3.

Similarly, as illustrated in FIG. 3, each of the third and fourth signal vias 114c and 114c can be aligned with respective ones of the anti-pads 116 that are spaced from each other, for instance along the longitudinal direction L. Thus, it can be said that at least one of the third and fourth signal vias 114c and 114d can be aligned with an anti-pad (for instance with respect to a view along the transverse direction T). The third and fourth signal vias 114c and 114d can be aligned with a common one of the anti-pads 116 as illustrated in FIG. 1, or the third and fourth signal vias 114c and 114d can be aligned with respective separate ones of the anti-pads 116 that are spaced from each other as illustrated in FIG. 3. Thus, it can be said that at least one of the third and fourth signal vias 114c and 114d can be surrounded by an outer perimeter of an antipad (for instance, with respect to a view along the transverse direction T). Each of the third and fourth signal vias 114c and 114d can be surrounded by a perimeter of a single common one of the anti-pads 116 as illustrated in FIG. 1, or the third and fourth signal vias 114c and 114d can be surrounded by respective perimeters of separate ones of the anti-pads 116 that are spaced from each other as illustrated in FIG. 3.

The printed circuit board 100, and in particular the ground layer 102b, may further include at least one group 136 of at least one ground isolation vias, denoted by "g." For instance, the printed circuit board 100 can include a first group 136a of at least one ground isolation via g such as a plurality of ground isolation vias g. The printed circuit board 100 can further include a second group 136b of at least one ground isolation via g such as a plurality of ground isolation vias g. Each of the ground isolation vias g can be configured as an electrically conductive ground isolation via g. For instance, each of the electrically conductive ground isolation vias g can define a respective hole 134 that extends along the transverse direction T at least into or through the one or more of the conductive layers 102a and 102b, and at least into or through the one or more of the electrically insulative layers 106a and 106b.

Each of the holes 134 can be at least partially plated, including fully plated, with a conductive surface 120, such that each of the holes 134 can be referred to as a plated through-hole. Alternatively or additionally, each hole 117 can be partially filled with a conductive metal. Thus, each of the ground isolation vias g can be referred to as an electrically conductive via. Further, each of the ground isolation vias g can define a size and/shape that is unable to receive or not intended to receive the mounting portions of the electrical ground contacts of the complementary electrical connector that is mounted to the printed circuit board 100. Alternatively or additionally, the ground isolation vias g can be positioned so as to be out of alignment with the mounting portions of the electrical contacts (including ground and signal contacts) of the complementary electrical connector that is mounted to the printed circuit board in a manner such that the mounting portions of the electrical signal contacts are received by respective ones of the signal vias S, and the mounting portions of the electrical ground contacts are received by respective ones of the ground vias G. Thus, the holes 134 of each of the ground isolation vias g may be of a cross-sectional dimension along a plane defined by the longitudinal and lateral directions, such as a diameter, that is smaller than the holes 117 of the ground vias 112. Further, the holes 134 of each of the ground isolation vias g may be of a cross-sectional dimension along the plane defined by the longitudinal and lateral directions, such as a diameter, that is smaller than the holes 118 of the ground vias 112. It should be appreciated, however, that the cross-sectional dimensions of the holes 134 can be as desired, for instance equal to those of one or both of the ground vias 112 or the signal vias 114. Because the ground isolation vias g are not intended to receive a mounting portion of an electrical contact of the complementary electrical connector that is mounted to the printed circuit board 100, the ground isolation vias g can also be referred to as unused ground vias, or merely as an unused ground.

In accordance with one embodiment, the first group 136a of ground isolation vias g can include three of the ground isolation vias g. The ground isolation vias g of the first group 136a can be arranged such that the first group 136 is substantially linear. For instance, the first group 136a of ground isolation vias g can be elongated in the longitudinal direction L, parallel to signal vias 114a, 114b. Thus, the first group 136a of ground isolation vias g can be parallel to the electrical traces 108a-b. Thus, the first group 136a can be centered about a first group center line C4 that extends in the longitudinal direction. For example, each of the ground isolation vias g of the first group 136a can be at least partially aligned with center line C4 that passes through the ground isolation vias. For instance, each of the ground isolation vias g of the first group 136a can be fully aligned with the first group center line C4 that passes through the center of the ground isolation vias g.

In accordance with one embodiment, the second group 136b of ground isolation vias g can include three of the ground isolation vias g. The ground isolation vias g of the second group 136b can be arranged such that the second group 136b is substantially linear. For instance, the second group 136b of ground isolation vias g can be elongated in the longitudinal direction L, parallel to signal vias 114c, 114d. Thus, the second group 136b of ground isolation vias g can be parallel to the electrical traces 108a-b. Thus, the second group 136b can be centered about a second group center line C5 that extends in the longitudinal direction L. For example, each of the ground isolation vias g of the second group 136b can be at least partially aligned with the second group center line C5 that passes through the ground isolation vias g. For instance, each of the ground isolation vias g of the second group 136b can be fully aligned with the second group center line C5 that passes through the center of the ground isolation vias g.

Thus, in accordance with one embodiment, one or more groups 136 of ground isolation vias g may be disposed along one or both of center lines C4 and C5. Alternatively or additionally, the printed circuit board 100 can include one or more additional groups 136 of ground isolation vias g disposed along respective group center lines. As described above, the ground isolation vias g can be positioned so as to be out of alignment with the mounting portions of the electrical contacts (including ground and signal contacts) of the complementary electrical connector that is mounted to the printed circuit board in a manner such that the mounting portions of the electrical signal contacts are received by respective ones of the signal vias S, and the mounting portions of the electrical ground contacts are received by respective ones of the ground vias G. For example, the first group centerline C4 of the first group 136a of ground isolation vias g may be positioned adjacent to the first array centerline C2 of the first linear array 110a along the lateral direction A, and can be spaced from the first array centerline C2 by a distance less than or greater than the card pitch of the complementary connector. Thus, the first group centerline C4 can be spaced from the first array centerline C2 along the lateral direction A by a distance that is not an integer multiple of the card pitch of the complementary connector. Similarly, the second group centerline C5 of the second group 136b of ground isolation vias g may be positioned adjacent to the second array centerline C3 of the first linear array 110a along the lateral direction A, and can be spaced from the second array centerline C3 by a distance less than or greater than the card pitch of the complementary connector. Thus, the second group centerline C5 can be spaced from the second array centerline C3 along the lateral direction A by a distance that is not an integer multiple of the card pitch of the complementary connector.

According to an embodiment, at least one group 136 of ground isolation vias g aligned along a respective group center line, in combination with at least one electrical trace 108, including a differential pair of electrical traces 108, can be located between consecutive ones of the first and second linear arrays 110a and 110b with respect to the lateral direction A. Stated differently, consecutive ones of the first and second linear arrays 110a and 110b can be separated by at least one group of ground isolation vias 136 and at least one electrical signal trace, including a differential pair of traces 108, along the lateral direction A. Stated in yet another way, consecutive ones of the first and second linear arrays 110a and 100b that each contain one or more ground vias 112 and one or more signal vias 114, including the respective antipads, arranged in, for example, the repeating linear array pattern 138 may be separated by at least one group 136 of ground isolation vias g aligned along a respective group center line, and at least one electrical trace 108 such as a differential pair of electrical traces 108 along the lateral direction A.

Thus, when moving along a straight reference line oriented in the lateral direction A from the first linear array 110a toward the second linear array 110b, the reference line can cross, in sequence, the first linear array 110a; at least one electrical trace 108 such as a differential pair of electrical traces 108; and a group 136 of ground isolation vias g, and the second linear array 110b. This pattern may repeat along the lateral direction A, for instance from the second linear array 110b toward another first linear array 110a. Thus, when moving along a straight reference line oriented in the lateral direction A from the second linear array 110b to the first linear array 110a, the reference line can cross, in sequence, the second linear array 110b, a group 136 of ground isolation vias g, at least one electrical trace 108 such as a differential pair of traces 108, and the first linear array 110a. This pattern may repeat along the lateral direction A. The printed circuit board 100 can define a region 140 that is located between one of the linear arrays 110 and at least one electrical trace 108. For instance, the region 140 can be located between the first linear array 110a, and at least one electrical trace 108, such as the differential pair of signal traces 108 along the lateral direction A. The region 140 can be devoid of ground isolation vias g. Alternatively, the printed circuit board 100 can include one or more ground isolation vias g in the region 140. The region 140 can extend along a lateral dimension along the lateral direction A between the first linear array 110a and the at least one electrical trace 108, and can further extend along a longitudinal dimension in the longitudinal direction so as to define a rectangular area defined by the lateral dimension and the longitudinal dimension. Stated differently, the region 140 may define an area extending between anti-pads 116a of the first linear array 110a and the differential signal traces 108 along the lateral direction A that can be devoid of ground isolation vias g, or can include at least one ground isolation via g. Similarly, the printed circuit board 100 may further be understood to contain a region 142 located between one or more groups 136 of ground isolation vias g, arranged along a respective group center line, and one of the linear arrays 110. For instance, the region 142 can be disposed between the second group 136b of ground isolation vias g and the second linear array 100b along the lateral direction A. The region 142 can define an area that can be defined by a longitudinal dimension along the longitudinal direction L, and a lateral dimension along the lateral direction between the second group 136b of ground isolation vias g and the second linear array 100b. Stated differently, region 142 may define an area extending between anti-pads of the second linear array 110b and the second group 136b of ground isolation vias g along the lateral direction A. The region 142 can be devoid of electrical signal traces.

In one embodiment, the first center line C1 can be spaced from the first array center line C2 a second distance D2 along the lateral direction. The second group center line C5 of the second group 136b of ground isolation vias g can be spaced from the first center line C1 by a third distance D3 along the lateral direction A. The second array center line C3 of the second linear array 110b may be spaced from second group center line C5 of the second group 136b of ground isolation vias g by a fourth distance D4 along the lateral direction. The second distance D2 can be greater than the third distance D3. Further, the fourth distance D4 can be greater than the third distance D3. Further still, the second distance D2 can be equal to or different than the fourth distance D4.

In accordance with one embodiment, the printed circuit board can define a sixth centerline C6 that is located midway between the first array center line C2 and the second array center line C3. The sixth center line C6 extends in the longitudinal direction L. The sixth center line C6 can be offset with respect to the first center line C1 along the lateral direction. Thus, the second distance D2 can be greater than or less than half of the first distance D1 such that center line C1 is not aligned with centerline C6. Stated differently, the sixth centerline C6 may be located a distance equal to one half of the first distance D1 from both of the first and second group centerlines C2 and C3. When the first center line C1 is not aligned with centerline C6, the electrical traces 108 can be said to be routed asymmetrically with respect to the sixth centerline C6. Stated in yet another manner, when the first centerline C1 is not aligned with sixth centerline C6, the electrical traces can be said to be routed asymmetrically with respect to one or both of the first and second linear arrays 110a and 110b and their respective first and second array centerlines C2 and C3.

Furthermore, each group 136 of ground isolation vias g can be at least partially or fully aligned with a respective linear array pattern 138 along the lateral direction A. A group 136 of ground isolation vias g can be fully aligned with a linear array pattern 138 when, for example, respective lines extending in the lateral direction A through the center of each of the respective ground isolation vias g extend through the respective linear array pattern 138. For example, as illustrated in FIG. 1, the first group 136a of ground isolation vias g is fully aligned with the G-S-S-G pattern 138 of the first linear array 110a because a straight line extending centrally through each of the ground isolation vias g along the lateral direction A intersects the respective first group center line C2 at the linear array pattern 138. At least a select one of the ground isolation vias g of the first group 136a can be disposed between the first and second signal vias 114a and 114b of the first linear array 110a with respect to the longitudinal direction. The select one of the ground isolation vias g can be a middle one of the ground isolation vias g of the first group 136a with respect to the longitudinal direction L. At least a pair of the ground isolation vias g of the first group 136a can be positioned such that each of the first and second signal vias 114a and 114b are disposed between the pair of the ground isolation vias g of the first group 136a with respect to the longitudinal direction L. The pair of the ground isolation vias g of the first group 136a can be outermost ones of the ground isolation vias g of the first group 136a with respect to the longitudinal direction L.

Similarly, the second group 136b of ground isolation vias g is fully aligned with the G-S-S-G pattern 138 of the second linear array 110b because a straight line extending centrally through each of the ground isolation vias g along the lateral direction A intersects the respective second group center line C3 at the linear array pattern 138. At least a select one of the ground isolation vias g of the second group 136b can be disposed between the third and fourth signal vias 114c and 114d of the second linear array 110b with respect to the longitudinal direction. The select one of the ground isolation vias g can be a middle one of the ground isolation vias g of the second group 136b with respect to the longitudinal direction L. At least a pair of the ground isolation vias g of the second group 136b can be positioned such that each of the third and fourth signal vias 114c and 114d are disposed between the pair of the ground isolation vias g of the second group 136b with respect to the longitudinal direction L. The pair of the ground isolation vias g of the second group 136b can be outermost ones of the ground isolation vias g of the second group 136b with respect to the longitudinal direction L.

Furthermore one of the outermost ones of the ground isolation vias g of the first group 136a can be aligned with one of the outermost ones of the ground isolation vias g of the second group 136b, while the opposed outermost ones of the ground vias g of each of the first and second groups 136a and 136b is out of alignment with all of the vias of the other of the first and second groups 136a and 136b along the lateral direction A. For instance, the opposed outermost ones of the ground isolation vias g of each of the first and second groups 136a and 136b is offset from all ground isolation vias of the other of the first and second groups 136a and 136b with respect to the longitudinal direction L. The ground isolation vias g of each of the groups 136 can be equally spaced from each other along the longitudinal direction L. Alternatively, the ground isolation vias g of each of the groups 136 can be variably spaced from each other along the longitudinal direction L, but operatively associated with a respective one of the linear arrays 100, or linear array patterns 138.

Furthermore, individual linear array patterns 138 from the first linear array 110a may be fully or partially aligned with individual linear array patterns 138 from the second linear array 110b. For example, respective straight lines extending in the lateral direction A can extend through the center of each respective ground via 112 and signal via 114 in the linear array patterns 138 of each of the linear arrays 110a and 110b. In illustrated embodiment, the linear array pattern 138 of the first linear array 110a is partially aligned with the linear array pattern 138 of the second linear array 110b. Partial alignment may occur when less than all of the lines extending in the lateral direction A through the center of each respective ground via 112 and signal via 114 of the linear array pattern 138 of the first linear array 110a extends through the center of each of respective ground via 112 and signal via 114 of the linear array pattern 138 of the second linear array 110b.

Without being bound by theory, it is believed that the groups 136 of ground isolation vias g positioned as described above define a Faraday shield that prevents crosstalk between differential signal pairs that are spaced from each other along the lateral direction A. Further, the positioning of one or more groups 136 of ground isolation vias g along a single line, such as the second group 136b of ground isolation along the second group center line C5, can be sufficient to mitigate cross talk while providing more area between linear arrays 110 with respect to the prior art. The increased area allows the electrical traces to extend along respective paths that achieve zero skew routing. The ground isolation vias g can be of the same size as the ground vias 112 (instead of being smaller), and/or ground isolation vias g can be spaced further away from the signal trace(s) 108 to minimize impedance discontinuity that can be caused by having placing the isolation vias g too close to the signal trace(s) 108. The ground isolation vias can g also be spaced further from antipads to improve PCB manufacturability.

In accordance with one embodiment, a method can be provided for reducing crosstalk in a printed circuit board. The method can include the steps of 1) routing a first electrical signal trace along a first direction, 2) disposing an electrically conductive layer below the first electrical signal trace along a second direction that is perpendicular to the first direction, the electrically conductive layer extending along a plane that is normal to the second direction, 3) spacing at least one electrically conductive signal via from at least one electrically conductive ground via along the first direction in a first linear array, 4) spacing at least one electrically conductive signal via and at least one electrically conductive ground via along the first direction in a second linear array that is spaced from the first linear array along a third direction that is perpendicular to the first direction and the second direction, such that the first linear array and the second linear array are consecutive linear arrays along the third direction, and the first electrical signal trace is disposed between the first and second linear arrays with respect to the second direction, and 5) placing a group of ground isolation vias arranged along the first direction, the group of ground isolation vias being disposed between the first electrical signal trace and the second linear array.

In another embodiment, a method for reducing crosstalk in a printed circuit board can include the step of providing or teaching the use of a printed circuit board, such as printed circuit board 100 as described in connection with FIGS. 1A-2B. The method may further include teaching to the third party the step of mounting a complementary electrical component to the printed circuit board such that (1) a mounting portion of an electrical signal contact of the complementary electrical connector is inserted into one of the electrically conductive signal vias, (2) a mounting portion of a ground contact of the complementary electrical connector is inserted into one of the electrically conductive ground vias, and (3) no mounting portions of electrical contacts of the complementary electrical is aligned with any of the ground isolation vias. Thus, the ground isolation vias remains unused by the complementary electrical connector. The method can further include the step of selling to the third party the printed circuit board.

As described above, the printed circuit board 100 can be constructed as described in FIG. 1 or FIG. 3. Alternatively, FIG. 1 can illustrate a first section 100a of the printed circuit board 100, and FIG. 3 can illustrated a second section 100b of the printed circuit board 100 that is positioned below the first section 100a along the transverse direction T. The first and second sections 100a and 100b can be arranged consecutively with respect to each other, such that the printed circuit board 100 is devoid of additional layers disposed between the first and second sections 100a and 100b along the transverse direction T. Thus, the first electrically conductive layer 102a of the second section 100b can be disposed immediately adjacent the second insulative layer 106b of the first section 100a. The second insulative layer 106b of the first section 100a can be disposed between the second electrically conductive layer 102b of the first section 100a and the first electrically conductive layer 102a of the second section 100b. Alternatively, the printed circuit board 100 can include one or more additional layers disposed between the first and second layers 100a and 100b along the transverse direction T.

Accordingly, the first electrically conductive layer 102a of the first section 100a can be referred to as an upper electrically conductive layer, the second electrically conductive layer 102b of the first section 100a and the first electrically conductive layer 102a of the second section 100b can be referred to as middle electrically conductive layers, and the second electrically conductive layer 102b of the second section 100b can be referred to as a lower electrically conductive layer. The first and second linear arrays 110a and 110b of the section 100b can be referred to as third and fourth linear arrays of the printed circuit board 100. The first center lines C1 of the first and second sections 100a and 100b can be aligned with each other along the transverse direction T, such that a plane defined by the transverse direction T and the longitudinal direction L can pass through each of the first center lines C1 of the first and second sections 100a and 100b. Alternatively, a portion up to all of each of the first center lines C1 of the first and second sections 100a and 100b can be offset from the other of the first center lines C1 of the first and second sections 100a and 100b along the lateral direction A.

The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein, unless otherwise indicated. Accordingly, the invention is intended to encompass all modifications and alternative arrangements included within the spirit and scope of the invention, for instance as set forth by the appended claims.

What is claimed:

1. A printed circuit board comprising:
    at least one electrical signal trace elongate along a first direction;
    an electrically conductive ground layer disposed below the at least one electrical signal trace along a second direction that is perpendicular to the first direction, the electrically conductive ground layer extending along a plane that is normal to the second direction;
    a first linear array that includes at least one electrically conductive signal via and at least one electrically conductive ground via, the first linear array oriented along the first direction;
    a second linear array that includes at least one electrically conductive signal via and at least one electrically conductive ground via, the second linear array being oriented along the first direction and being spaced from and consecutive with the first linear array along a third direction that is perpendicular with respect to each of the first and second directions such that no other linear arrays that (i) are oriented along the first direction and (ii) include an electrically conductive signal via are disposed between the first linear array and the second linear array with respect to the third direction; and
    at least one group of ground isolation vias that is oriented along the first direction, the at least one group of ground isolation vias disposed between the at least one electrical signal trace and the second linear array with respect to the third direction,
    wherein the at least one electrical signal trace is disposed between the first and second linear arrays with respect to the third direction.

2. The printed circuit board of claim 1, wherein the at least one electrical signal trace is a first electrical signal trace, the printed circuit board further comprising a second electrical signal trace that is elongate along the first direction parallel to the first electrical signal, wherein the first electrical signal trace and the second electrical signal trace combine to define a differential pair of electrical signal traces.

3. The printed circuit board of claim 2, wherein the differential pair of electrical signal traces is disposed in a plane that is spaced from the electrically conductive ground layer.

4. The printed circuit board of claim 1, wherein the first linear array is spaced from the second linear array a first distance along the third direction, the first distance defining a linear array pitch of the printed circuit board.

5. The printed circuit board of claim 4, wherein the at least one electrical signal trace is spaced a second distance from the first linear array along the third direction, the at least one electrical signal trace is spaced a third distance from the at least one group of ground isolation vias along the third direction, the at least one group of ground isolation vias is spaced a fourth distance from the second linear array along the third direction, and each of the second and fourth distances is greater than the third distance.

6. The printed circuit board of claim 5, wherein the second distance is equal to the fourth distance.

7. The printed circuit board of claim 5, wherein first distance is greater than the fourth distance.

8. The printed circuit board of claim 4, wherein the at least one group of ground isolation vias is spaced a distance from the second linear array along the third direction, and wherein the distance is less than the linear array pitch of the printed circuit board.

9. The printed circuit board of claim 1, further comprising:
   a first region devoid of ground vias, the first region disposed between the first linear array and the at least one electrical signal trace along the third direction; and
   a second region devoid of electrical signal traces, the second region being defined between the second linear array and the at least one group of ground isolation vias along the third direction.

10. The printed circuit board of claim 1, wherein the at least one signal trace is arranged asymmetrically with respect to a centerline that is spaced equidistantly between the first linear array and the second linear array, the centerline extending along the first direction.

11. The printed circuit board of claim 1, wherein the first linear array includes a differential pair of electrically conductive signal vias, and the second linear array includes a differential pair of electrically conductive signal vias.

12. The printed circuit board of claim 11, wherein the at least one electrical signal trace comprises a differential pair of electrical signal traces that are electrically coupled to respective ones of the differential signal pair of signal vias of the first linear array.

* * * * *